US009907210B2

(12) United States Patent  
Buvid et al.

(10) Patent No.: US 9,907,210 B2  
(45) Date of Patent: Feb. 27, 2018

(54) ACTIVE PERFORATION FOR ADVANCED SERVER COOLING

(71) Applicant: International Business Machines Corporation, Armonk, NY (US)

(72) Inventors: Daniel J. Buvid, Rochester, MN (US); Eric J. Campbell, Rochester, MN (US); Tyler Jandt, Rochester, MN (US); Joseph Kuczynski, North Port, FL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 281 days.

(21) Appl. No.: 14/751,039

(22) Filed: Jun. 25, 2015

(65) Prior Publication Data

US 2016/0381830 A1 Dec. 29, 2016

(51) Int. Cl.  
*H05K 7/20* (2006.01)

(52) U.S. Cl.  
CPC ..... *H05K 7/20618* (2013.01); *H05K 7/20718* (2013.01); *H05K 7/20836* (2013.01)

(58) Field of Classification Search  
CPC .......... H05K 7/20618; H05K 7/20718; H05K 7/20836

(Continued)

(56) References Cited

U.S. PATENT DOCUMENTS 3,698,587 A * 10/1972 Baker .............. B60K 15/03177  
220/560.02  
3,867,728 A * 2/1975 Stubstad ............. A61F 2/30907  
128/DIG. 21

(Continued)

FOREIGN PATENT DOCUMENTS

WO 2004055656 A1 7/2004

OTHER PUBLICATIONS

Iverson et al., "Recent advances in microscale pumping technologies: a review and evaluation." Microfluidics and nanofluidics 5.2 (2008), Birck and NCN Publications, Jan. 2008 pp. 145-174.

(Continued)

*Primary Examiner* — Ljiljana Ciric  
(74) *Attorney, Agent, or Firm* — Patterson + Sheridan, LLP

(57) ABSTRACT

Embodiments of the present disclosure generally relate to the thermal management and regulation of electronic equipment. Microfluidic channels are utilized to actively change the aerodynamics of a surface, which may allow for the ability to change a surface texture from flat to raised, or dimpled, or from open to closed. The changing of the surface texture influences the fluid flow over or through the surface, thus allowing for thermal regulation of the surface. The thermal regulation system further controls fluid flow through an electronic device via a coating, or layer, having a plurality of active perforations thereon. The active perforations may open and close to increase and decrease the inlet of air to the system in order to help balance the back pressure in the system and redirect airflow to more sensitive system components. Active perforations may be individually opened and/or closed depending on location and system component utilization.

7 Claims, 11 Drawing Sheets

(58) Field of Classification Search
USPC .......................................................... 62/3.2
See application file for complete search history.

(56) References Cited

U.S. PATENT DOCUMENTS

| | | | | |
|---|---|---|---|---|
| 5,580,033 | A * | 12/1996 | Burkley | F16F 9/0409 264/258 |
| 6,340,874 | B1 | 1/2002 | Vladimir | |
| 6,485,625 | B1 * | 11/2002 | Simpson | B01J 19/0093 204/450 |
| 6,501,654 | B2 | 12/2002 | O'Connor et al. | |
| 6,525,936 | B2 | 2/2003 | Beitelmal et al. | |
| 7,144,616 | B1 * | 12/2006 | Unger | B01L 3/502707 137/833 |
| 7,315,448 | B1 | 1/2008 | Bash et al. | |
| 7,320,457 | B2 | 1/2008 | Heim et al. | |
| 7,394,182 | B2 | 7/2008 | Pelrine et al. | |
| 7,701,643 | B2 | 4/2010 | Batchko et al. | |
| 7,898,176 | B2 | 3/2011 | Li et al. | |
| 8,845,403 | B2 | 9/2014 | Archibald et al. | |
| 2001/0029983 | A1 * | 10/2001 | Unger | B01L 3/502707 137/597 |
| 2002/0029814 | A1 * | 3/2002 | Unger | B01L 3/502707 137/824 |
| 2002/0136861 | A1 * | 9/2002 | Funakoshi | B29C 44/0407 428/119 |
| 2002/0144738 | A1 * | 10/2002 | Unger | B01L 3/502707 137/824 |
| 2003/0080442 | A1 * | 5/2003 | Unger | B01L 3/5025 257/787 |
| 2005/0015026 | A1 * | 1/2005 | Well | A61H 31/006 601/44 |
| 2005/0016887 | A1 * | 1/2005 | Yewdall | A61F 15/001 206/440 |
| 2006/0130923 | A1 * | 6/2006 | Lepola | F16L 55/1654 138/98 |
| 2006/0241542 | A1 * | 10/2006 | Gudnason | A61F 13/0203 602/59 |
| 2007/0172837 | A1 * | 7/2007 | Schleifer | B01J 19/0046 435/6.12 |
| 2007/0183935 | A1 * | 8/2007 | Clemmens | B01F 11/0071 422/400 |
| 2008/0210322 | A1 * | 9/2008 | Unger | B01L 3/502707 137/833 |
| 2008/0277007 | A1 * | 11/2008 | Unger | B01L 3/502707 137/833 |
| 2009/0061755 | A1 | 3/2009 | Calder et al. | |
| 2009/0192653 | A1 | 7/2009 | Songukrishnasamy et al. | |
| 2009/0302064 | A1 * | 12/2009 | Lavabre | B05B 11/0018 222/207 |
| 2010/0064610 | A1 | 3/2010 | Kulkarni et al. | |
| 2010/0143848 | A1 * | 6/2010 | Jain | B81C 1/0019 430/315 |
| 2010/0151781 | A1 | 6/2010 | Slessman et al. | |
| 2010/0192306 | A1 * | 8/2010 | Dennis | A47C 27/14 5/699 |
| 2011/0072589 | A1 * | 3/2011 | Dennis | A47C 27/14 5/691 |
| 2012/0136488 | A1 * | 5/2012 | Tan | G05D 23/1934 700/278 |
| 2013/0068427 | A1 * | 3/2013 | Williams | F04B 17/03 165/121 |
| 2013/0093289 | A1 * | 4/2013 | Zhang | H01L 41/0973 310/348 |
| 2014/0261630 | A1 * | 9/2014 | Morgan | H01L 31/02008 136/246 |
| 2014/0323968 | A1 * | 10/2014 | Rogers | H05K 13/0023 604/113 |
| 2015/0090113 | A1 * | 4/2015 | Galloway | B25J 9/142 92/48 |
| 2015/0107233 | A1 * | 4/2015 | Ou | F15B 15/10 60/327 |
| 2015/0133593 | A1 * | 5/2015 | kissell | C08K 5/175 524/496 |
| 2015/0237711 | A1 * | 8/2015 | Rogers | H05K 1/028 174/251 |
| 2015/0297394 | A1 * | 10/2015 | Young | A61F 7/0097 607/96 |
| 2016/0027737 | A1 * | 1/2016 | Rogers | H01L 23/5387 257/618 |
| 2017/0200707 | A1 * | 7/2017 | Rogers | H01L 25/0753 |

OTHER PUBLICATIONS

Xu et al., "Development, characterization, and theoretical evaluation of electroactive polymer-based micropump diaphragm." Sensors and Actuators A: Physical 121.1 (2005): 267-274.

Piyasena et al. "Electroosmotically driven microfluidic actuators." Sensors and Actuators B: Chemical 141.1 (2009): 263-269.

Khosla et al., "Fabrication of multiwalled carbon nanotube polydimethylsiloxne nanocomposite polymer flexible microelectrodes for microfluidics and MEMS." SPIE Smart Structures and Materials+ Nondestructive Evaluation and Health Monitoring. International Society for Optics and Photonics, 2010.

David Salerno, Linear Technology; Journal of Analog Innovation—vol. 20 No. 3, Oct. 2010, "Ultralow Voltage Energy Harvester Uses Thermoelectric Generator for Battery-Free Wireless Sensors", pp. 1-10. <http://cds.linear.com/docs/en/lt-journal/LTJournal-V20N3-01-df-LTC3108_09-David_Salerno.pdf>.

Anonymous (Wikipedia Author), http://en.wikipedia.org/wiki/Thermostat, article dated prior to Mar. 2009.

Dolomite Peristaltic Pumps, The Dolomite Centre Ltd-©, The Dolomite Centre Ltd 2010, retrieved Jun. 25, 2015. <http://www.dolomite-microfluidics.com/webshop/pumps-peristaltic-pumps-c-38_48>.

Schmidt et al., "Challenges of data center thermal management", IEEE (IBM Journal of Research and Development), 2005.

O'Halloran et al.; AC 2012-3976: Power and Efficiency Measurement in a Thermoelectric Generator, American Society for Engineering Education, 2012.

Dearing et al., "Electro-Active Polymer (EAP) "Dimple" Actuators for Flow Control: Design and Characterisation", Department of Aeronautics, Imperial College, London, England (2010). <https://spiral.imperial.ac.uk:8443/bitstreann/10044/1/15460/2/Sensors%20and%20Actuators%20A%20-%20Physical_157_2_2010.pdf>.

Joseph Bennington-Castro; "Smart Morphable Surfaces Can Dimple At Will, Reducing Air Drag", Materials Research Society, Jul. 10, 2014. <http://www.materials360online.com/newsDetails/47333>.

Tactus: A New Dimension of Touch, Tactus Technology ©2012, pp. 1-13. <http://tactustechnology.com/wp-content/uploads/2014/08/White-Paper-New-Tagged-PDF.pdf>.

Buvid et al., "Active Perforation for Advanced Server Cooling", U.S. Appl. No. 14/751,046, filed Jun. 25, 2015.

IBM "List of IBM Patents or Patent Applications Treated As Related".

* cited by examiner

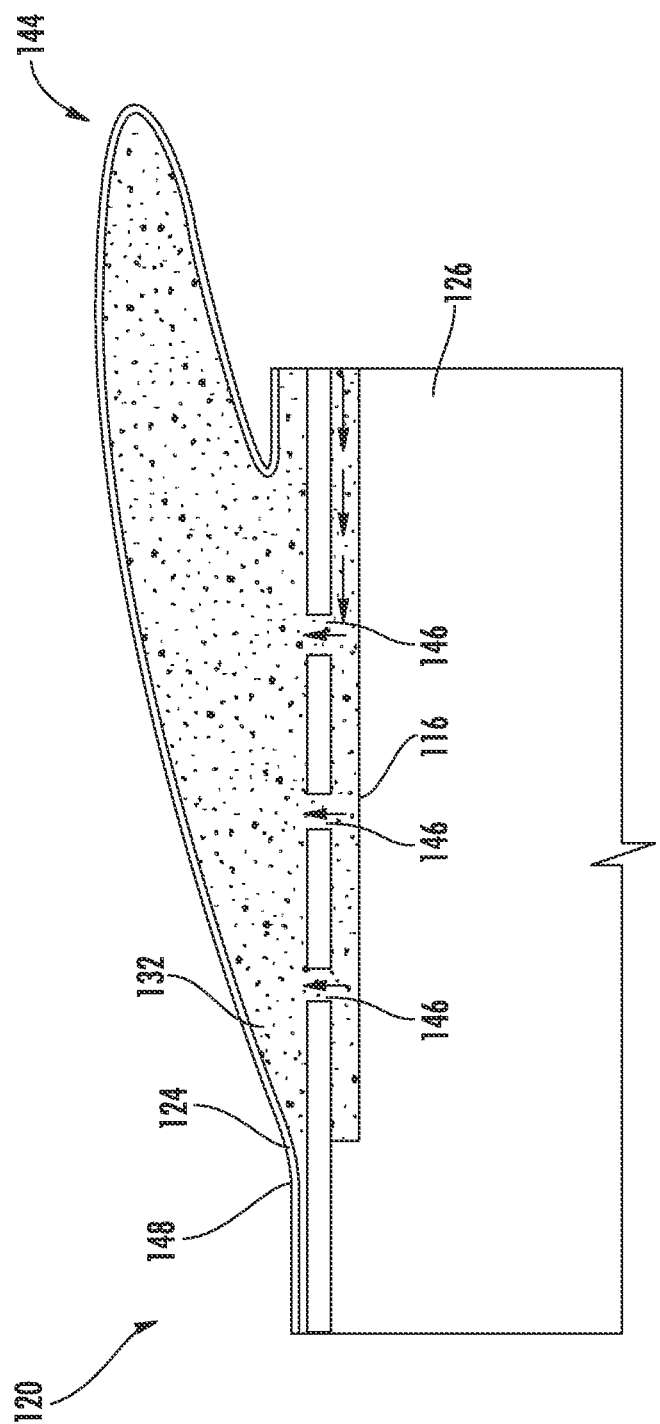

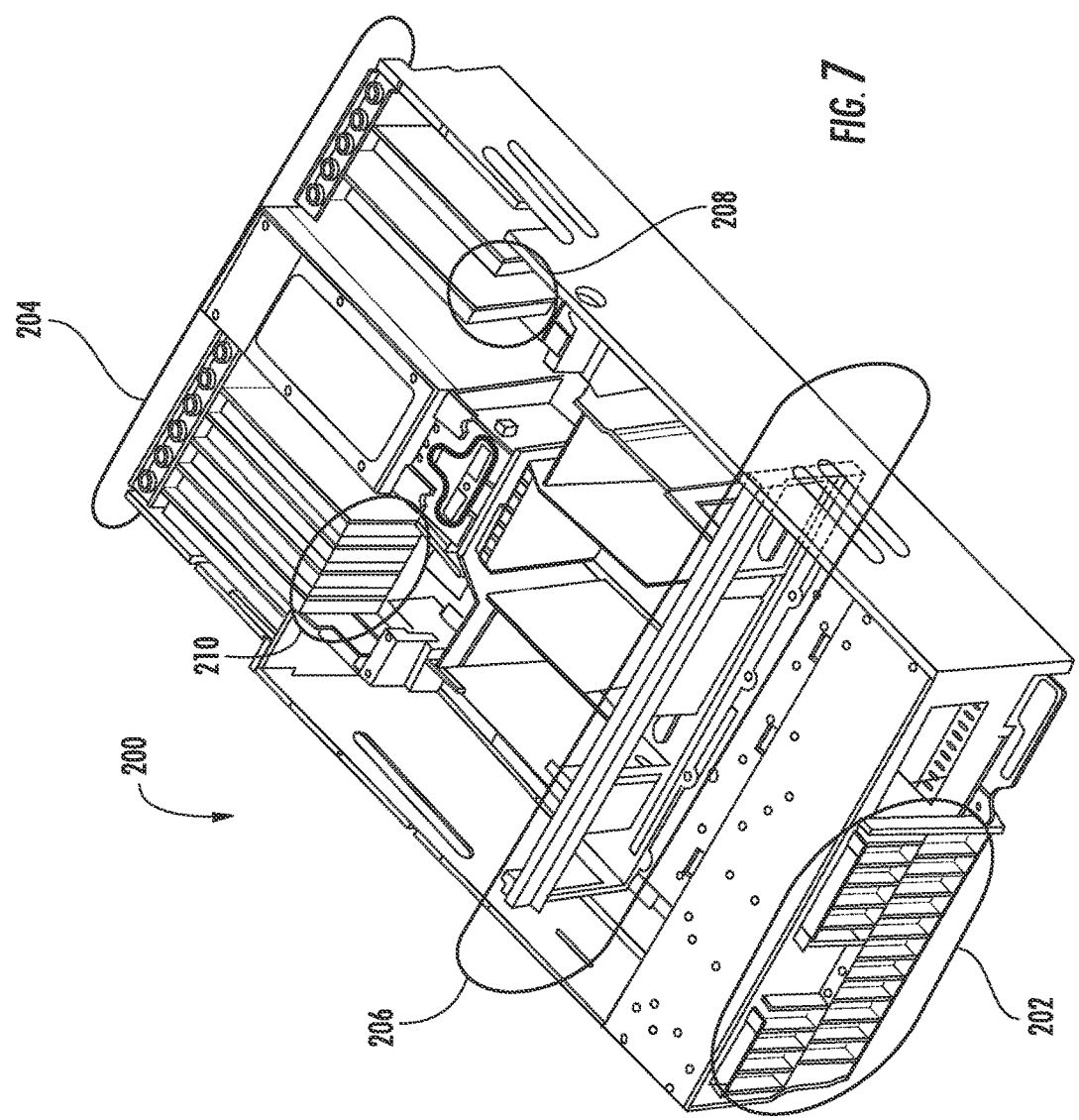

ACTIVE PERFORATION FOR ADVANCED SERVER COOLING

BACKGROUND

Embodiments of the present disclosure generally relate to thermal management of electronic equipment. More specifically, embodiments disclosed herein relate to a system and method for controlling fluid flow through an electronic device.

SUMMARY

Embodiments disclosed herein generally relate to the thermal management and regulation of electronic equipment. Microfluidic channels may be utilized to actively change the aerodynamics of a surface, which may further allow for the ability to change a surface texture from flat to raised, or dimpled, or from open to closed. The changing of the surface texture influences the fluid flow over and/or into the surface, thus allowing for thermal regulation of the surface. The thermal regulation system further controls fluid flow through an electronic device via a coating, or layer, having a plurality of active perforations thereon. The active perforations may open and close to increase and decrease the amount of fluid, such as air, flowing into the system in order to help balance the back pressure in the system and redirect airflow to more sensitive components. Active perforations may be individually opened and/or closed depending on location and component utilization.

In one embodiment, a thermal regulation system for controlling fluid flow through an electronic device is disclosed. The thermal regulation system may include an active perforation layer. The active perforation layer may have a plurality of active perforations thereon. Each active perforation may define a controllable aperture. The active perforation layer may include an elastomeric layer, a substrate, and an operating fluid. The substrate may provide a fluid channel and at least one expandable reservoir for each active perforation, wherein the fluid channel has a fluid inlet and a fluid outlet. An operating fluid may be operatively connected with the fluid channel. The operating fluid may enter the fluid channel via the fluid inlet to expand the expandable reservoir, and may exit the fluid channel via the fluid outlet.

In another embodiment, a thermal regulation system for controlling fluid flow through an electronic device is disclosed. The thermal regulation system may include an active perforation layer. The active perforation layer may have a plurality of active perforations thereon. Each active perforation may define a controllable aperture. The aperture size of each controllable aperture may be controllable between a first position, a second position, and a third position based on an input received from a temperature sensor. The first position may be a closed position, the second position may be an open position, and the third position may be a position between the first position and the second position. The active perforation layer may include a substrate. The substrate may provide a fluid channel and at least one expandable reservoir for each active perforation, wherein the fluid channel has a fluid inlet and a fluid outlet. An operating fluid may be operatively connected with the fluid channel. The operating fluid may enter the fluid channel via the fluid inlet to expand the expandable reservoir and may exit the fluid channel via the fluid outlet.

In yet another embodiment, a method for controlling the thermal regulation of a device is disclosed. The method comprises (a) receiving a real-time temperature reading from a temperature sensor operatively connected with the device, (b) comparing the real-time temperature reading to a predetermined acceptable temperature of the device, and (c) determining whether the real-time temperature reading is outside of the predetermined acceptable temperature. The method further comprises (d) issuing a signal to a thermoelectric device when the real-time temperature reading is outside of the predetermined acceptable temperature, and (e) responsive to the signal, outputting a voltage signal by the thermoelectric device, wherein a magnitude and a polarity of the voltage signal are dependent on a magnitude and a polarity of the difference in the real-time temperature reading and the predetermined acceptable temperature. The method also comprises (f) in proportion to the voltage signal, controlling a plurality of active perforations fluidly coupled to the device by adjusting a respective aperture of each of the plurality of active perforations, wherein the apertures regulate fluid flow therethrough.

BRIEF DESCRIPTION OF THE SEVERAL VIEWS OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

FIG. 5B illustrates a front plan view of fluid entering the active perforation of FIG. 5A, according to one embodiment.

FIG. 7 illustrates a perspective view of a computer system, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
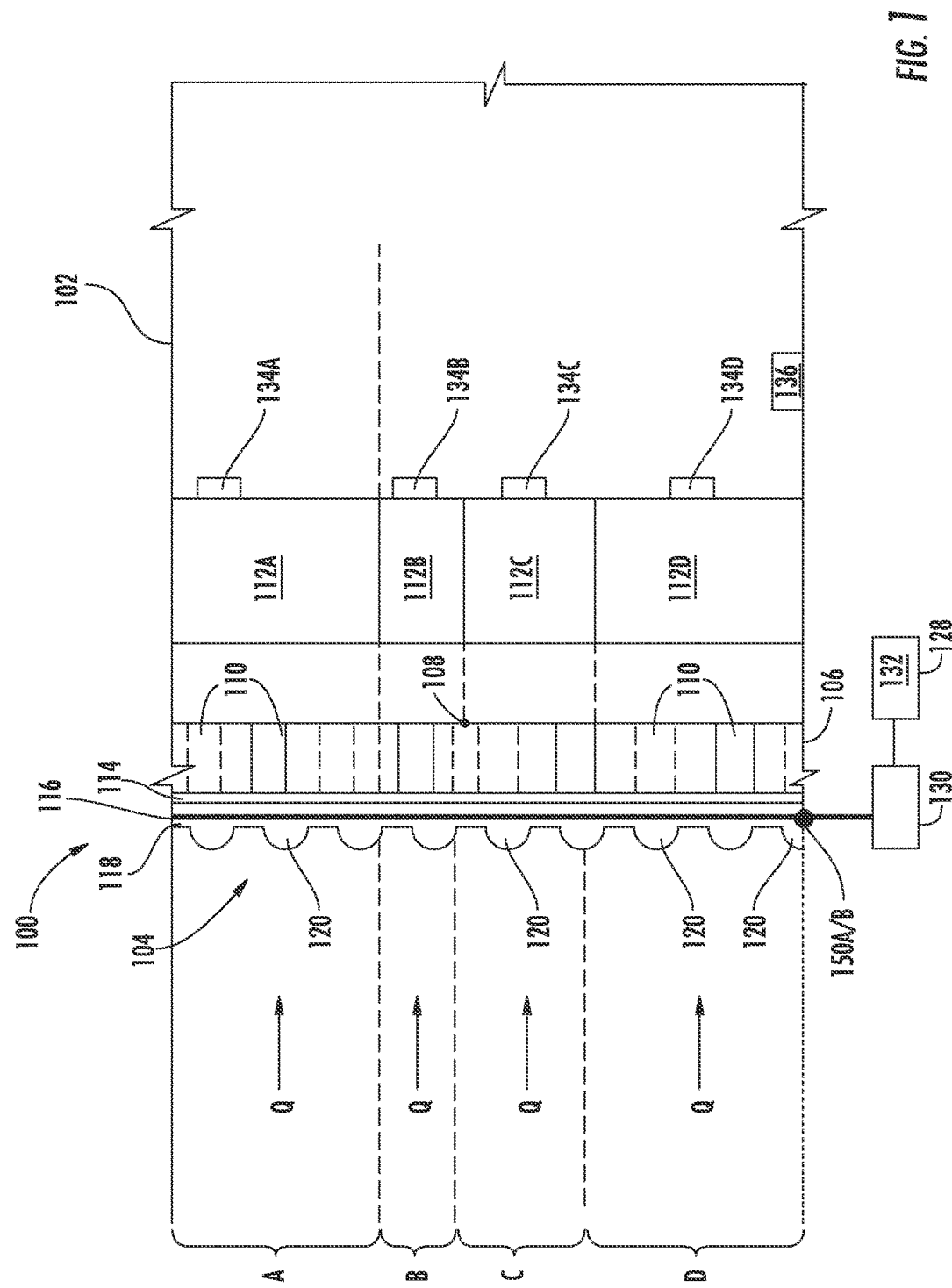
FIG. 1 illustrates a side cross-sectional view of a data center cabinet, according to one embodiment.

At the outset, it should be noted that although the embodiments disclosed are described with reference to electronic equipment, the disclosure may be practiced in any application requiring heat transfer or thermal regulation.

Data center equipment cabinets are typically used to house various types of electronic equipment such as servers and other computer system components. Data centers typically involve a large number of rack-mounted servers that are housed together in storage cabinets. When in use, processors and other electronic equipment housed within produce large amounts of heat which must be extracted because if the processors and electronic equipment are continually exposed to high temperatures, damage to the equipment may result and cause equipment failures. Similarly, individual computer electronic components may be housed within individual computer housings. The electronic components also produce large amounts of heat within the individual computer housings which must be extracted for similar reasons.

Heat must be dissipated at a rate sufficient to maintain critical system components at acceptable temperatures in order to prevent premature component or system failure. While small increases in operating temperatures may not be immediately damaging to the operation of the electronic components, long term operation at high temperatures may adversely affect component life and reliability. This is especially true for sensitive components such as data storage components or circuitry. Additionally, operating speeds and reliability of electronic systems may be negatively affected as the temperature of their individual components rises.

The maximum allowable temperature range for servers and other electronic equipment typically housed within a data center or other casing, such as for example only, a computer housing or casing, is between approximately about 59 degrees Fahrenheit and 95 degrees Fahrenheit. Typical ways to exchange heat within a data center or device may include the pumping of cold air into the data center or device, the utilization of a raised floor to act as a cooling agent, bores which function to permit cooling fluid to flow through the device, cabinet, or casing surrounding the data center or components in combination with fans, and/or the utilization of perforated floor tiles to cool components and other electronics.

Additional conventional approaches to providing heat transfer may include the use of a fan to draw cool air from outside the system into an enclosure in which system components may be located, the use of heat sinks, or increasing the air inlet bore size to allow more air into the enclosure.

However, rising processing speeds and high capacity circuits cause greater thermal loads, thus requiring greater air flow through the system to dissipate such heat quickly.

As the foregoing illustrates, there is a need for a system and method for cooling electronic equipment that efficiently and effectively delivers cooled air where needed to reduce the overheating of system components. Additionally, it would be beneficial to redirect cooled air to areas of need automatically. Therefore, what is needed is an active perforation for advanced server cooling.

Embodiments of the present disclosure generally relate to the thermal management and regulation of electronic equipment. Microfluidic channels may be utilized to actively change the aerodynamics of a surface, which may further allow for the ability to change a surface texture from flat to raised, or dimpled, or from open to closed. The changing of the surface texture influences the fluid flow over the surface, thus allowing for thermal regulation of the surface. The thermal regulation system may control fluid flow through an electronic device via a layer having a plurality of active perforations thereon. The active perforations may open and close to increase and decrease the inlet of air to the system in order to help balance the back pressure in the system and redirect airflow to more sensitive components. Active perforations may be individually opened and/or closed depending on location and component utilization. Still further, a combination of surface texture and active perforations may be employed to achieve thermal regulation.

FIG. 1 illustrates a side cross-sectional view of an electronic device 100. Examples of electronic devices may include, but are not limited to, a server, a personal computer, a laptop computer, a cellular telephone, etc. As illustrated in the embodiment of FIG. 1, the electronic device is a personal computing system. The electronic device 100 may, however, be any type of device which requires thermal regulation. The electronic device 100 includes a housing 102 surrounding and supporting components of the electronic device 100. The housing 102 may be, by way of example only, a data center cabinet, a server cabinet, a computer tower cabinet, a laptop case, or the like. As illustrated in the embodiment of FIG. 1, the housing 102 is a computer tower cabinet. The housing 102 may serve to protect the electronic device 100 by surrounding the components within the electronic device 100.

The housing 102 may surround, support, and protect system components 112 of the electronic device 100. Any number of system components 112 may be located and operatively connected within the housing 102. The system components 112 may be any component which contributes to the operation, functioning, appearance, support, form, maintenance, use, and/or setup of the electronic device 100. The system components 112 may include, for example, PCIe cards, graphics cards, interconnects, motherboards, CPUs, and the like. Although four system components 112A-112D are shown in the embodiment of FIG. 1, it is contemplated that any number of system components 112 may be utilized.

Each system component 112 of the electronic device 100 may be operatively connected with an individual temperature sensor 134. It is further contemplated that in some embodiments, areas within the electronic device 100 may be operatively connected with individual temperature sensors 134 rather than individual system components 112. In the embodiment shown in FIG. 1, each system component 112A-112D may be operatively connected with a temperature sensor 134A-134D, respectively. Each temperature sensor 134A-134D may detect in real-time the temperature of the corresponding system component 112A-112D.

The housing 102 of the electronic device 100 may have a perforation panel 106 on a first side 108 of the housing 102. The perforation panel may be an outer wall of the housing 102 and may protect the electronic device 100 encased within the housing 102. The perforation panel 106 may have one or more perforations 110, such as holes, slots, slits, or rings, therein, and the perforations 110 may be of any size. The perforations 110 may be sized large enough to allow fluid to enter the housing 102, however small enough to prevent undesired material from entering the housing 102. The perforations 110, however, are unable to control the amount of fluid entering the housing 102, as well as unable to direct the fluid to areas within the housing 102. Additionally, the perforation panel may be made of metal or any other suitable housing material.

As further shown in the embodiment of FIG. 1, the electronic device 100 may have a thermal regulation system 104. The thermal regulation system 104 may control fluid flow through the electronic device 100. The thermal regulation system 104 may be coupled with individual system components 112. The active perforation layer 118 may also be constructed onto a fan, such as, by way of example only, a housing enclosing the fan. Additionally, the thermal regulation system 104 may be coupled with the perforation panel 106 of the electronic device 100 via an adhesive layer 114. The adhesive layer 114 may be a fluid permeable adhesive. The adhesive layer 114 may be an adhesive applied around the outer perimeter of and between the thermal regulation system 104 and the perforation panel 106, such that the thermal regulation system 104 is coupled to the perforation panel 106. In another embodiment, the adhesive layer 114 may couple the thermal regulation system 104 with the perforation panel 106 via a layer of adhesive located between the thermal regulation system 104 and the perforation panel 106. It is contemplated that the thermal regulation system 104 may be directly coupled with the housing 102, the system components 112, and/or the perforation panel 106.

The thermal regulation system 104 may act to regulate and manage the temperature inside of the housing 102, the temperature of specific zones within the housing 102, and/or the temperature of specific system components 112 of the electronic device 100 by controlling the amount of fluid Q allowed to pass therethrough and into the electronic device 100, zone, or system component 112. The thermal regulation system 104 may comprise an active perforation layer 118. The active perforation layer 118 may be a polymer coating. The polymer coating may be a PDMS polymer. In some embodiments, the active perforation layer 118 may be a two part polymer coating (See FIGS. 5A, 5B, 6A, 6B). A first layer 124, such as a top layer, of the active perforation layer 118 may be an elastomeric layer. A second layer 126 of the active perforation layer 118 may be a substrate which provides a fluid channel 116, such as for example a microfluidic pathway, and a reservoir 128. In some embodiments, the reservoir may be expandable. The first layer 124 and the second layer 126 may be a PDMS polymer. Furthermore, the active perforation layer 118 may have a plurality of active perforations 120 thereon.

In some embodiments, the fluid channel 116 may be located within the active perforation layer 118 and between the active perforations 120 and the adhesive layer 114. In embodiments comprising a two part polymer coating, the fluid channel 116 may be located within the second layer 126, between the first layer 124 and the adhesive layer 114. The fluid channel 116 of each embodiment may operate in a substantially similar manner, and, therefore, the embodiment disclosed below may equally apply to either of the above disclosed embodiments. The fluid channel 116 may be operatively connected with the active perforations 120 at a first end and operatively connected with a reservoir 128 at a second end. Furthermore, the fluid channel 116 may have a fluid inlet 150A and a fluid outlet 150B. However, in some embodiments the fluid inlet 150A may also serve as the fluid outlet 150B, such that the flow direction of the fluid is reversed. The reservoir may store fluid 132, such as a liquid. A microfluidic pump 130 may be operatively connected with the fluid channel 116 between the active perforations 120 and the reservoir 128. The microfluidic pump 130 may pump, or drive, fluid 132 through the fluid channel 116 from the reservoir 128 to each of the plurality of active perforations 120 within the active perforation layer 118. In some embodiments, the fluid 132 pumped may be a low-shear fluid. In some embodiments the fluid 132 pumped may be a chemically inert fluid and/or an electrically inert fluid. An example of such fluid 132 may be, for purposes of illustration only, 3M® NOVEC. The fluid 132 may have a first temperature upon exiting the reservoir 128 and entering the fluid channel 116. However, after passing through the active perforation layer 118, thus cooling the system components 112, the fluid 132 may have a second temperature upon exiting the active perforation layer 118. The second temperature of the fluid 132 may be greater than the first temperature of the fluid 132 due to a heat exchange between the fluid 132 and the system component 112.

The active perforations 120 may extend outward from the active perforation layer 118, such that the active perforations 120 alter a surface dimension of the active perforation layer 118 to form, for example, a button or bubble radiating outward from the surface of the active perforation layer 118. Each active perforation 120 may have a diameter of between about two millimeters and about thirty millimeters, for example between about four millimeters and about ten millimeters. The active perforations 120 may allow for an increase or a decrease in the amount of fluid Q into the housing 102 of the electronic device 100. When open, each active perforation 120 may allow for fluid Q to flow through a controllable aperture 122 (See FIGS. 3, 4A, 4C, 5A, and 6A) of the active perforation 120. In some embodiments, the active perforations 120 may further be individually controlled. In some embodiments, individual groups of active perforations 120 may be controlled together. By controlling individual groupings of active perforations 120 together, designated areas, or zones, within the electronic device 100 and/or designated system components 112 may be individually cooled. By way of example, as shown in FIG. 1, the active perforations of group A may be controlled together to regulate the fluid Q flowing to the first system component 112A. The active perforations of group B may be controlled together to regulate the fluid Q flowing to the second system component 112B. The active perforations of group C may be controlled together to regulate the fluid Q flowing to the third system component 112C. Additionally, the active perforations of group D may be controlled together to regulate the fluid Q flowing to the fourth system component 112D. As such, by way of continued example, the active perforations of groups A and C may be opened, while the active perforations of groups B and D are closed to create zone specific control within the electronic device 100. Alternatively, by way of continued example, the active perforations of group D may be opened, while the active perforations of groups A, B, and C are closed to create zone specific control within the electronic device 100. By regulating the amount of fluid Q into the electronic device 100 and/or the individual system components 112A-112D, the back pressure within the electronic device 100 may be balanced.

For purposes of illustration only, and not intended to be limiting, the first system component 112A may be a PCIe card. Utilization of the first system component 112A may cause the first system component 112A to generate heat above a normal operating temperature of the first system component 112A. Extended use of a system component 112 at temperatures above the normal operating temperature may permanently damage or otherwise render inoperable the system component 112A. Therefore, fluid Q, such as air, must be directed to the system component 112A in order to cool the system component 112A to an acceptable and safe operating temperature. As such, when exercised at maximum utilization, system component 112A may require increased airflow, thus requiring the active perforations 120 within group A to be opened. The opening of the active perforations 120 within group A allows fluid Q to be directed at the system component 112A. Likewise, when the system component 112A is not being utilized, the active perforations 120 of group A may be closed. When closed, the active perforations 120 redirect fluid flow to other components. It is contemplated, however, that during periods of both usage and non-usage, the active perforations 120 within group A may be at a location substantially between open and closed.

The electronic device 100 may also include a controller 136. The controller facilitates the control and automation of the thermal regulation system 104. The controller 136 may be coupled to or in communication with one or more electronic devices 100, the thermal regulation system 104, the system components 112, the fluid channel 116, the active perforation layer 118, the active perforations 120, the reservoir 128, the microfluidic pump 130, and/or the temperature sensors 134. The thermal regulation system 104, the system components 112, the microfluidic pump 130, the reservoir 128, and/or the temperature sensors 134 may provide information to the controller 136 regarding active perforation 120 status, system component 112 or local environment temperature, fluid 132 movement, fluid 132 availability, microfluidic pump 130 functionality, and the like.

The controller 136 may include a central processing unit (CPU) (not shown), memory (not shown), and support circuits (or I/O) (not shown). The CPU may be one of any form of computer processors that are used in industrial settings for controlling various processes and hardware (e.g., pumps, temperature sensors and readings, motors, and other hardware) and monitor the processes (e.g., time, position, location, temperature, and the like). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller 136 determines which tasks are performable within the electronic device 100 and/or the thermal regulation system 104. The program may be software readable by the controller 136 and may include code to monitor and control, for example, the temperature, air flow, active perforation status, or fluid status within the electronic device 100 and/or the thermal regulation system 104.

Figure 2:
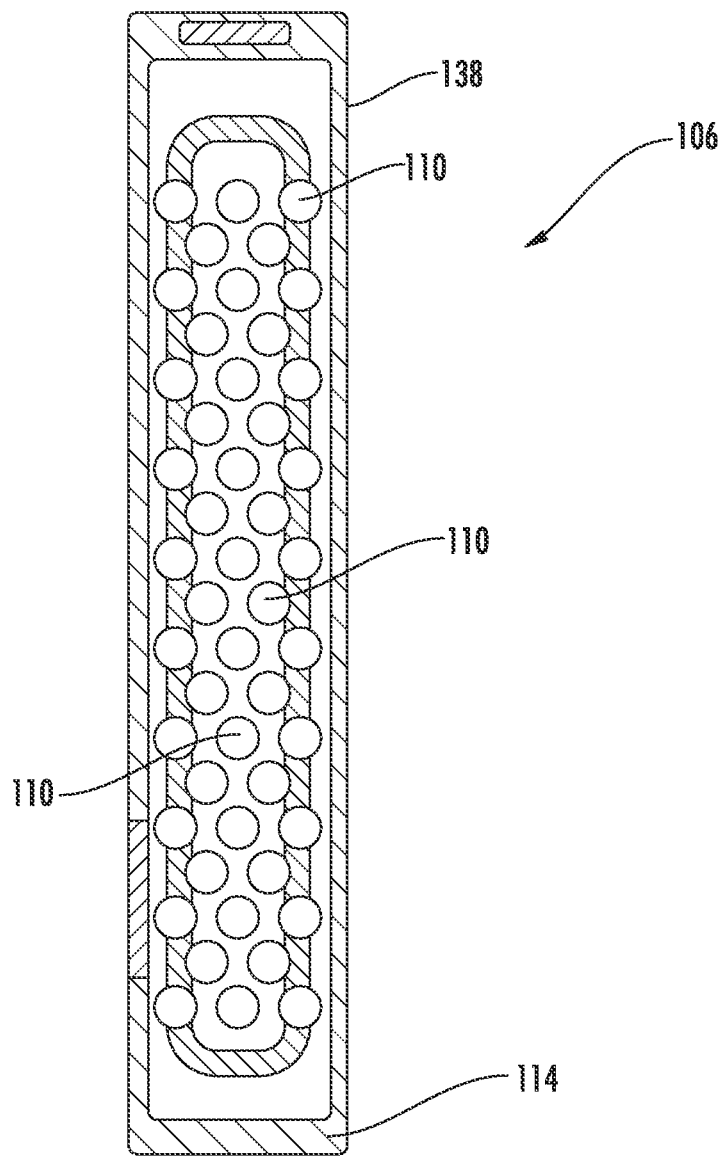
FIG. 2 illustrates a front plan view of the perforation panel of the data center cabinet of FIG. 1, according to one embodiment.

FIG. 2 illustrates a front plan view of the perforation panel 106 as shown in FIG. 1. The perforation panel 106 may be a plate with perforations 110, such as holes, slits, or slots, formed therein. The perforations 110 may be circular, ovular, rectangular, and/or of any suitable shape. The perforation panel 106 may be pre-formed on certain electronic devices 100, such as a server cabinet, a computer tower, or a laptop computer. However, the thermal regulation system 104 of the present disclosure may be added to an existing perforation panel 106. As discussed supra, the adhesive layer 114 may be around the outer perimeter 138 of the perforation panel 106. The adhesive layer 114 may be between the thermal regulation system 104 and the perforation panel 106, such that the thermal regulation system 104 is coupled to the perforation panel 106 via the adhesive. The perforations 110 of the perforation panel 106 of FIG. 2 may be permanent. As such, the perforations 110 themselves do not open or close.

Figure 3:
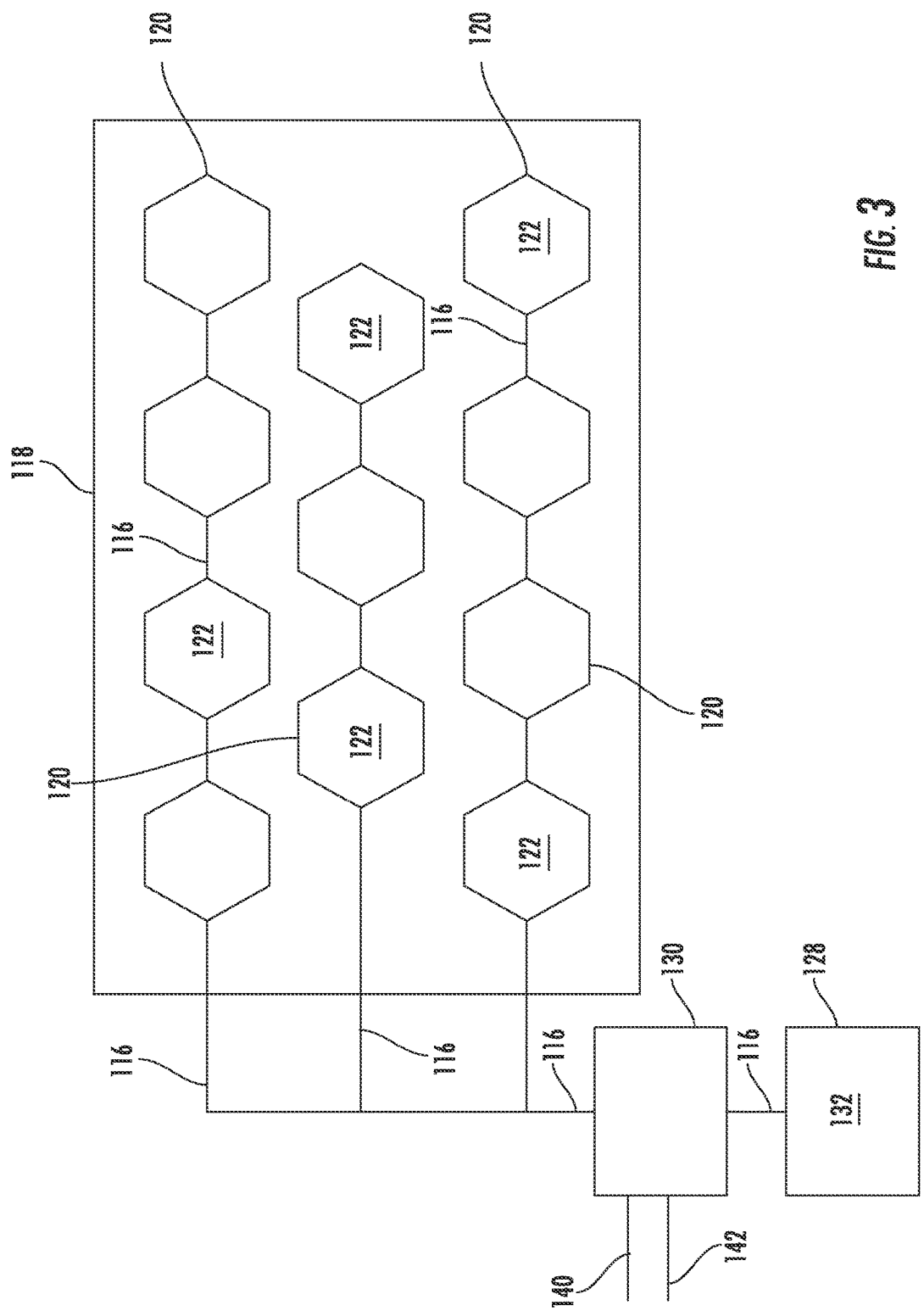
FIG. 3 illustrates a front plan view of the active perforation layer of the thermal regulation system, according to one embodiment.

FIG. 3 illustrates a front plan view of the active perforation layer 118 of the thermal regulation system 104. A plurality of active perforations 120 are disposed within the active perforation layer 118. In the embodiment of FIG. 3, the active perforations 120 represent Group A of FIG. 1, for example. The active perforations 120 are interconnected with each other via the fluid channel 116. The fluid channel 116 provides a pathway for the fluid 132 to activate each active perforation 120. The fluid channel is operatively connected to the microfluidic pump 130 to deliver the fluid 132 into the plurality of active perforations 120 via the fluid channel 116 to activate the active perforations 120 or may pump the fluid 132 out of the plurality of active perforations 120 to deactivate the active perforations. As such, the fluid 132 may flow in any direction within the fluid channel 116. In one embodiment, the microfluidic pump 130 may be a separate element coupled to the fluid channel 116 and the active perforation layer 118. In an alternative embodiment, the microfluidic pump 130 may be integrated within the active perforation layer 118. The microfluidic pump 130 may further be coupled to the reservoir 128 via the fluid channel 116. The microfluidic pump 130 may be operatively connected with a power supply 140 for powering the microfluidic pump 130, as well as operatively connected with the electronic device 100 via an electrical connection 142 as power may originate within the electronic device 100. Furthermore, as shown in FIG. 3, each active perforation 120 is in an open position such that an aperture 122 exists within each active perforation 120 of the active perforation layer 118.

The active perforation layer 118 of FIG. 3 may be coupled to the perforation panel 106 of FIG. 2 via the adhesive layer 114 such that the active perforation layer 118 covers the perforation panel 106. Each active perforation 120 of the active perforation layer 118 may correspond to and align with a single perforation 110 of the perforation panel 106. As such, each active perforation 120 of the active perforation layer 118 may be capable of opening to an aperture 122 having a diameter at least as large as a diameter of an individual perforation 110 of the perforation panel 106. Alternatively, each active perforation 120 of the active perforation layer 118 may be larger than an individual perforation 110 of the perforation panel 106. As such, an individual active perforation 120 of the active perforation layer 118 may have an aperture 122 large enough to expose more than one perforation 110 of the perforation panel 106. For example, activation of an individual active perforation 120 may open two or more perforations 110. Alternatively, each active perforation 120 of the active perforation layer 118 may be smaller than an individual perforation 110 of the perforation panel 106. As such an individual active perforation 120 of the active perforation layer 118 may not fully expose a full individual perforation 110 of the perforation panel 106. Therefore, multiple active perforations 120 may be grouped together in this embodiment to provide finer control over the fluid flow.

Figure 4A:
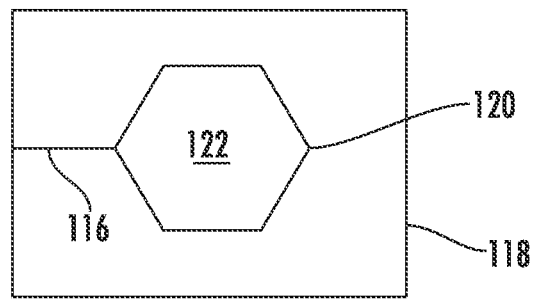
FIGS. 4A-4C each illustrate a front plan view of embodiments of the active perforation layer of FIG. 3, according to at least one embodiment.
Figure 4B:
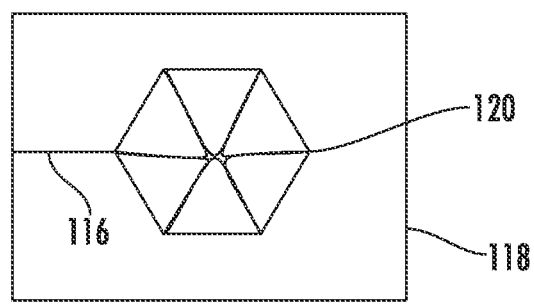
Figure 4C:
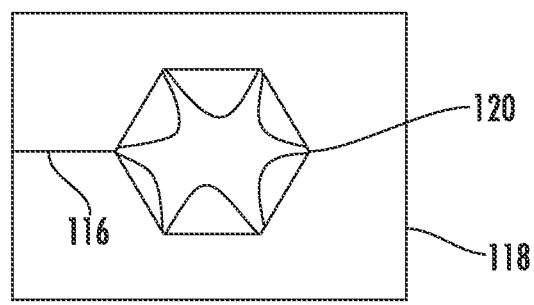

FIGS. 4A-4C illustrate embodiments of an individual active perforation 120 of the active perforation layer 118 in various positions. Each active perforation 120 maintains an aperture 122 controllable between at least a first closed position, a second open position, and a third partially open position. The position of the active perforation 120 may be determined by an input received from the temperature sensor 134. In the closed position, the aperture 122 is not exposed and the fluid flow is to be directed, or redirected, around the active perforation. In the open position, the aperture 122 is fully exposed and fluid flow therethrough is maximized. In the third position the aperture 122 is partially opened, regulating fluid flow between zero and fully open.

FIG. 4A illustrates a front plan view of an embodiment of an individual active perforation 120 of the active perforation layer 118 in the open position. When in the open position the full aperture 122 of the active perforation 120 is exposed and thus the active perforation 120 allows fluid, such as air, to be moved therethrough and access areas of high temperatures with the greatest rate of flow. Each active perforation 120 may be operatively connected to the fluid channel 116 such that fluid 132 may be pumped into or out of the active perforation 120. When the active perforation 120 is in the open position fluid 132 may be removed from the active perforation such that the microfluidic pump 130 moves fluid 132 away from and out of the active perforation 120. The open position of the active perforation 120 may be beneficial in that it allows for maximum fluid flow therethrough which may rapidly decrease the temperature of a system component 112 maintaining a temperature out of the acceptable temperature range and in immediate need of critical cooling.

FIG. 4B illustrates a front plan view of an embodiment of an individual active perforation 120 of the active perforation layer 118 in the closed position. When in the closed position, no portion of the aperture 122 is exposed and thus the active perforation 120 may not allow fluid, such as air, to be moved therethrough. The closed position may prohibit access to the perforation panel 106 thereunder. In order for the active perforation 120 to reach the closed position, fluid 132 may be pumped via the microfluidic pump 130 from the reservoir 128 to the active perforation 120 through the fluid channel 116. The closed position of the active perforation 120 may be beneficial in that it allows for fluid, such as air, flow to be redirected through and/or drawn to areas of need elsewhere within the electronic device in a short amount of time. As such, by closing active perforations 120 in areas where fluid flow is not required, such as in areas where system components 112 are not being utilized, the back pressure within the electronic device 100 may be balanced to ensure effective and efficient cooling of system components 112 being utilized.

FIG. 4C illustrates a front plan view of an embodiment of an individual active perforation 120 of the active perforation layer 118 in an intermediate position, wherein the intermediate position is between the open position and the closed position. When in the intermediate position the active perforation 120 may allow fluid, such as air, to be moved therethrough and access the perforation panel 106 and system components 112 within. In the intermediate position, a lesser amount of fluid may be allowed to pass through the active perforation 120 compared to the open position. In order for the active perforation 120 to reach the intermediate position, fluid 132 is pumped via the microfluidic pump 130 from the reservoir 128 to the active perforation 120 through the fluid channel 116; however, the fluid 132 may be pumped at a lower flow rate and/or for less time than the active perforation in the closed position. The intermediate position of the active perforation 120 may be beneficial in that it allows for fluid flow therethrough at a steady rate and may further allow for the maintaining of a stable temperature of a system component 112.

A temperature sensor 134 may be operatively connected to the controller 136, the thermal regulation system 104, and/or at least one system component 112 of the electronic device 100. The temperature sensor 134 receives real time information regarding the temperature of the system component 112. The controller 136 contains program logic storing information relating to a predetermined acceptable temperature range for each system component 112 of the electronic device. A predetermined acceptable temperature range for the system component 112 may be between approximately 59 and 95 degrees Fahrenheit, and between about 65 and 85 degrees Fahrenheit. When the temperature sensor 134 receives a temperature reading outside of the predetermined acceptable temperature range, the controller 136 directs the thermal regulation system 104 to open a single active perforation 120, a plurality of active perforations 120, a group of active perforations 120, and/or all active perforations 120 at least partially as shown in FIG. 4C or fully as shown in FIG. 4A. A maximum usage of the system component 112 may cause the system component temperature to elevate outside of the predetermined acceptable temperature range. The controller 136 may require maximum airflow through the active perforation 120 corresponding to the system component 112 for reducing the temperature of the system component 112. In such a case, the active perforations 120 corresponding to the area of the system component 112 may open fully as shown in FIG. 4A. During normal usage of the system component 112, the system component temperature may elevate to a temperature within the predetermined acceptable temperature range, however the temperature may be approaching the outer limits of the predetermined acceptable temperature range. The controller 136 may direct the thermal regulation system 104 to open a single active perforation 120, a plurality of active perforations 120, a group of active perforations 120, and/or all active perforations 120 at least partially as shown in FIG. 4C for reducing the temperature of the system component 112.

Figure 5A:
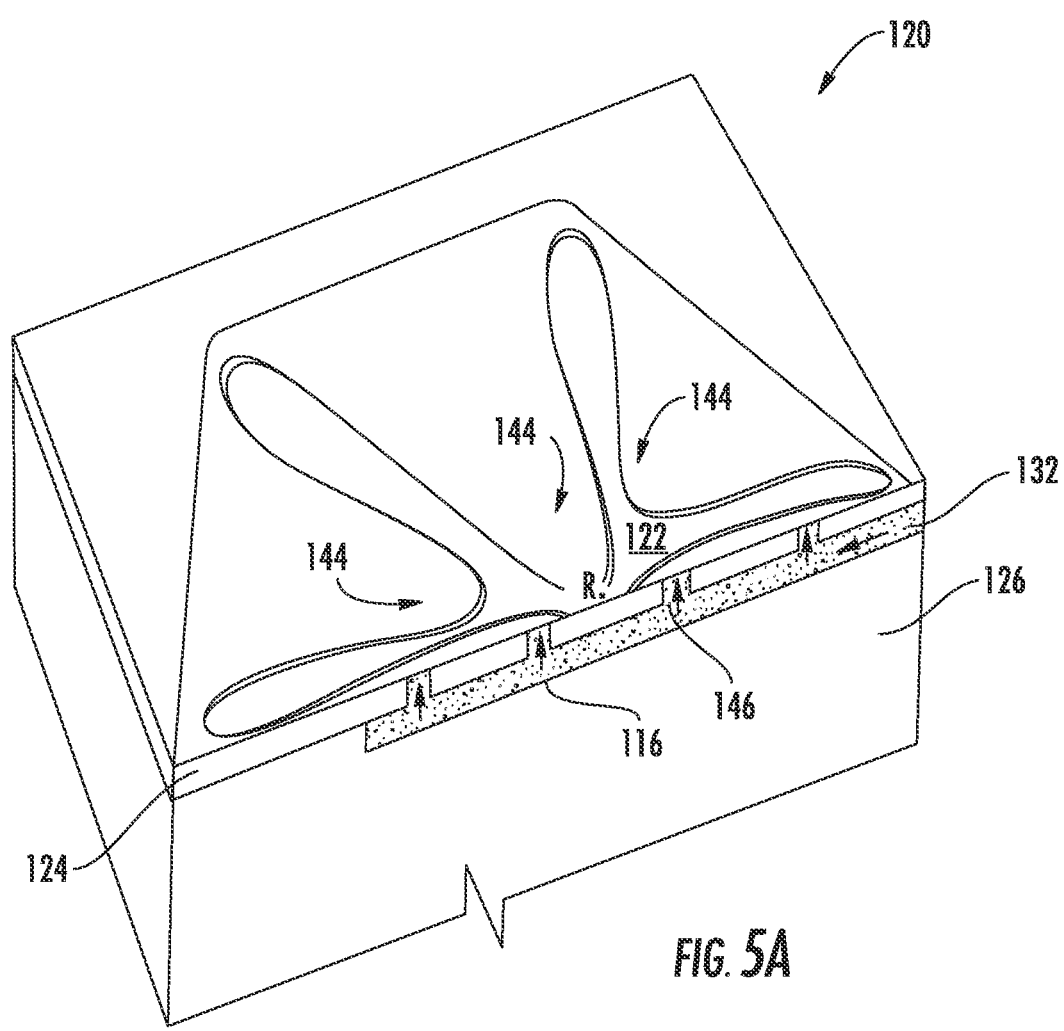
FIG. 5A illustrates a perspective view of fluid entering the active perforation, according to one embodiment.

FIGS. 5A and 5B illustrate fluid 132 entering the active perforation, according to one embodiment. In the embodiment shown, fluid 132 is delivered to the active perforation 120 to open the active perforation 120 and fully expose aperture 122.

Each active perforation 120 may be part of the active perforation layer 118. The active perforation 120 may be a polymer coating such as, by way of example only, a polydimethylsiloxane ("PDMS") polymer. The PDMS polymer may be a silicone based compound, such as a polymeric organosilicone compound. The active perforation layer 118 may maintain rheological properties such as being hydrophilic. Additionally, in certain embodiments, the active perforation layer 118 may be optically clear and/or inert. The active perforation layer 118 may be viscoelastic. In some embodiments, the active perforation layer 118 may be a two part polymer coating. A first layer 124, such as a top layer, of the active perforation layer 118 may be an elastomeric layer. A second layer 126 of the active perforation layer 118 may be a substrate which defines the fluid channel 116. The first layer 124 and the second layer 126 may each be a PDMS polymer.

In some embodiments, the fluid channel 116 may be located within the active perforation layer 118 and between the active perforations 120 and the adhesive layer 114. In embodiments comprising a two part polymer coating, the fluid channel 116 may be located within the second layer 126, between the first layer 124 and the adhesive layer 114. As shown in FIGS. 5A and 5B, the fluid 132 enters into the active perforation 120 via the fluid channel 116. Inlets 146 within the fluid channel 116 may direct the fluid 132 from the fluid channel 116 into the active perforation 120. Specifically, the fluid 132 may be directed into flaps 144 of the active perforation 120. The flaps 144 may be fluid sacks, or reservoirs, for holding fluid 132. The flaps 144 may be expandable reservoirs. In some embodiments, the flaps 144 may be compressible and expandable fluid sacks which hold a preformed shape when filled with fluid 132. When the flaps 144 are not filled with the fluid, the flaps 144 may compress.

As shown in FIGS. 4B and 4C, each active perforation 120 may have six flaps 144; however, it is contemplated that any number of flaps 144 may be utilized. When the active perforation 120 receives fluid, the flaps 144 fill with fluid, thus causing the flaps 144 to expand. The flaps 144 may expand toward a midpoint R of the aperture 122 of the active perforation 120 such that each flap 144 expands toward one another. Upon full expansion of each flap 144, the active perforation 120 closes as the aperture 122 becomes sealed by the flaps 144. When the active perforation 120 is closed, no fluid may pass therethrough.

Figure 6A:
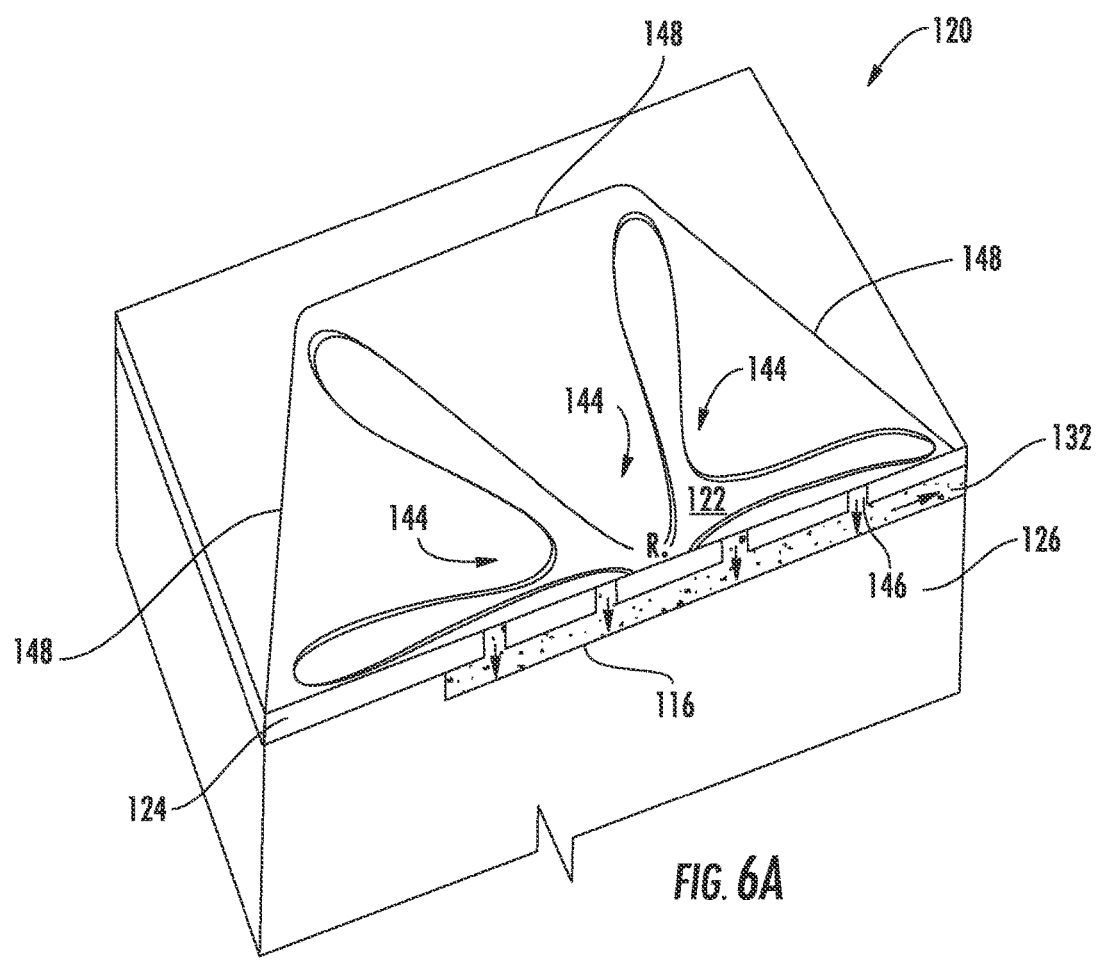
FIG. 6A illustrates a perspective view of fluid exiting the active perforation, according to one embodiment.
Figure 6B:
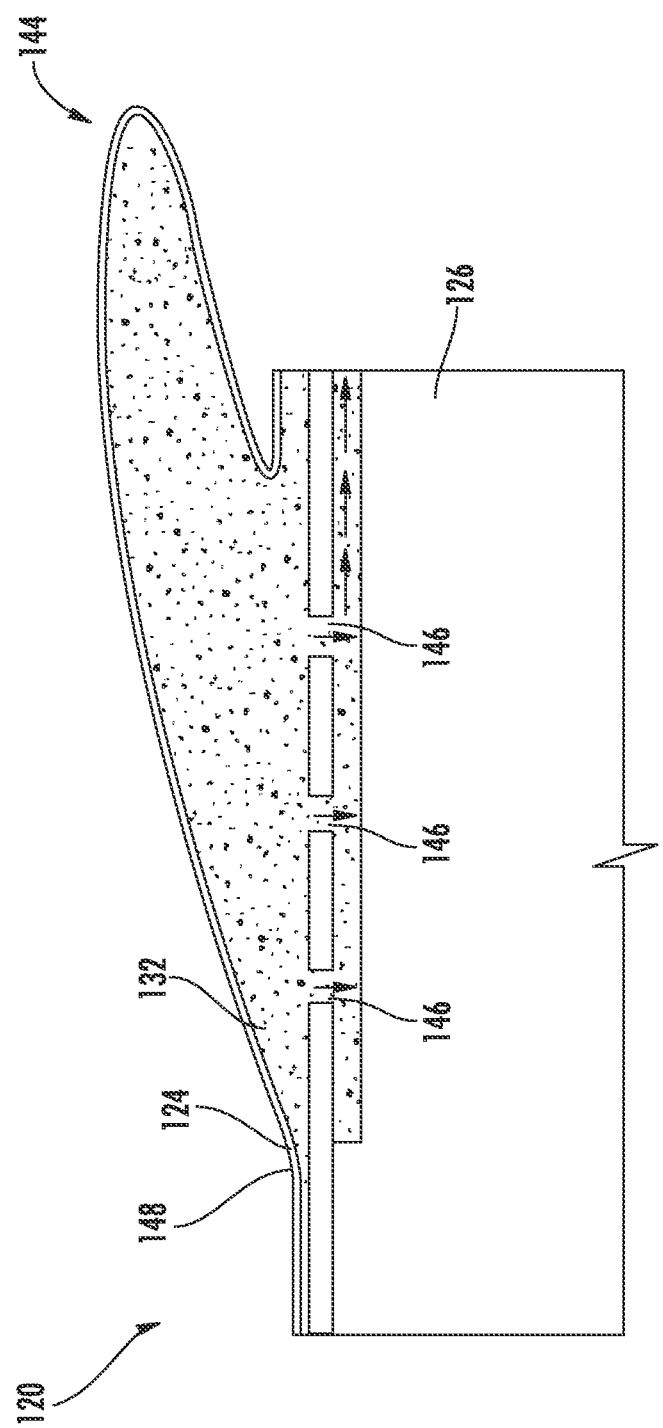
FIG. 6B illustrates a front plan view of fluid exiting the active perforation of FIG. 6A, according to one embodiment.

As shown in FIGS. 6A and 6B, the fluid 132 exits the active perforation 120 via the fluid channel 116. The fluid 132 may be directed out of the flaps 144 via the microfluidic pump 130, through the inlets 146, and out of the fluid channel 116. When the active perforation 120 is to be open, the fluid may be removed from the flaps 144 via the microfluidic pump 130, thus causing the flaps 144 to retract. When the flaps 144 retract, each flap 144 may move radially away from the midpoint R, thus causing the aperture 122 to be exposed. The flaps 144 may compress toward an outer edge 148 of the active perforation 120. Once the flaps 144 have compressed to the outer edge 148 of the active perforation 120, the aperture 122 is fully exposed allowing fluid to pass therethrough.

The electronic device 100 may turn on with the active perforations 120 in the open position. Once the electronic device 100 is on, the thermal regulation system 104 is turned on and begins monitoring the temperature sensors 134 to determine which system components 112 are being utilized and may require thermal regulation in real time. The temperature reading from the temperature sensors 134 are used to determine which system components 112 require cooling and/or which system components 112 do not require cooling. If the thermal regulation system 104, after receiving the temperature readings from the temperature sensors 134, determines that a particular system component 112 does not require cooling, or airflow, the active perforation 120 corresponding to said system component 112 may close to as direct airflow to higher risk system components 112, such as system components 112 being heavily utilized. If a particular system component 112 needs to be cooled the thermal regulation system 104 may determine the active perforation(s) 120 nearest the system component 112 requiring the cooling. If the active perforation(s) 120 nearest the system component 112 requiring the cooling is open, the thermal regulation system 104 may maintain the active perforation(s) 120 in the open position. If the active perforation(s) 120 nearest the system component 112 requiring the cooling is closed, the thermal regulation system 104 may activate the microfluidic pump 130 to open said active perforation(s) 120 nearest the system component 112 requiring the cooling.

FIG. 7 illustrates a perspective view of a computer system 200, according to one embodiment described herein. A first area 202, or zone, and a second area 204, or zone, represent locations of the computer system 200 exposed to and in contact with areas outside of the computer system 200. The first area 202 and the second area 204 each represent locations where the thermal regulation system 104 may be located. By positioning the thermal regulation system 104 outside of the computer system 200, fluid Q, such as air, may be directed to direct areas of need within the computer system 200 when required. For example, if the computer system 200 is off, the active perforations 120 of the thermal regulation system 104 within the first area 202 and the second area 204 may be closed or partially open. However, if the computer system 200 is being heavily utilized, the active perforations 120 of the thermal regulation system 104 within the first area 202 and the second area 204 may be opened, or partially opened. However, if the computer system 200 is running but is idling, sleeping, or not in a period of heavy use, the active perforations 120 of the thermal regulation system 104 within the first area 202 and the second area 204 may be in a position between the open position and the closed position, such as partially open. Additionally, a third area 206, fourth area 208, and a fifth area 210 may also benefit from the addition of a thermal regulation system 104 thereon. The third area 206, fourth area 208, and fifth area 210 may encompass areas, or zones, near critical system components 112, such as PCIe cards, graphics cards, and the like, that require active cooling.

Figure 8:
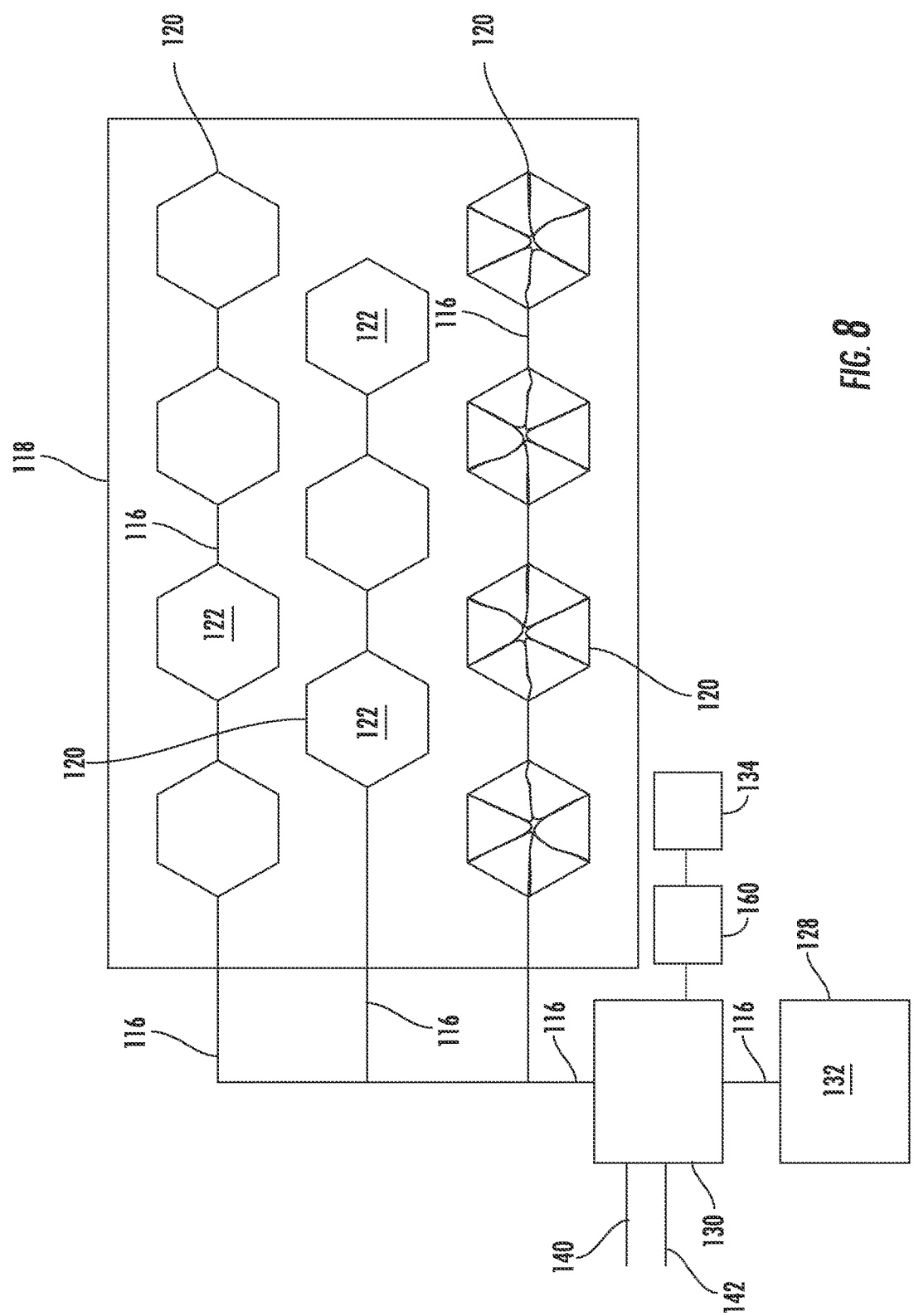
FIG. 8 illustrates a front plan view of the active perforation layer of the thermal regulation system, according to one embodiment.

In one embodiment, shown in FIG. 8, the thermal regulation system 104 may be a self-activating, self-opening, and/or self-closing thermal regulation system 104. Furthermore, the thermal regulation system 104 may self-power the active perforations 120. The active perforation 120 may be self-powered by operatively connecting a thermoelectric device 160 with the microfluidic pump 130 as part of the thermal regulation system 104. Additionally, the temperature sensor 134 may be in operative communication, such as operatively connected with, the electronic device 100 and/or the thermoelectric device 160. The thermoelectric device 160 may generate power when a change occurs in temperature of the system component 112. The change in temperature of the system component 112 may correspond to a change in voltage generated by the thermoelectric device 160. The magnitude and polarity of the voltage may be dependent upon the magnitude of the change in temperature and polarity of the change in temperature, i.e., whether the change in temperature is positive or negative. Therefore, the thermoelectric device 160 can activate the microfluidic pump 130 when a change in temperature occurs, i.e., when a system component 112 changes state from being utilized and generating heat, to not being utilized and not generating heat. This may allow for the active perforation(s) 120 most near the system component 112 to transform, or change surface features, when the system component 112 is changing state, thus allowing fluid flow, such as airflow, to increase or decrease near the system component 112 depending on whether the system component 112 is being utilized or not. During times when the system component 112 is not being utilized, fluid flow that may typically be supplied to the system component 112 may be redirected to other areas of the electronic device 100, such as to other system components 112, being utilized.

In the embodiment of FIG. 8, the active perforation layer 118 may be a self-activating active perforation layer 118. The self-activation may be caused by an electric charge generated during changes in temperature of the system component 112 monitored by the temperature sensor 134. When a system component 112 is heating up, a voltage may be generated to power the microfluidic pump 130 to open the active perforation 120. Thus, each active perforation 120 of the active perforation layer 118 may open, such as by opening the flaps 144 to the expose the aperture 122, upon the receipt of a first voltage generated by the thermoelectric device 160. When a positive change in temperature, i.e., an increase in temperature, above a normal operating temperature of the system component 112 is received by the temperature sensor 134, a first voltage may be generated by the thermoelectric device 160. The thermoelectric device 160 may power the microfluidic pump 130 via the power supply 140. The magnitude and polarity of the first voltage may be dependent upon the magnitude of the increased change in temperature of the system component 112, and a polarity of the change in temperature may be positive due to the increase in temperature.

Similarly, when a negative change in temperature below and/or within the normal operating temperature of the system component 112 is received by the temperature sensor 134, a second voltage may be generated by the thermoelectric device 160. The thermoelectric device 160 may power the microfluidic pump 130. The microfluidic pump 130 may close the active perforation 120 coupled to the area of the system component 112 that is below and/or within the normal operating temperature which corresponds to the negative change in temperature. The magnitude and polarity of the second voltage may be dependent upon the magnitude of the decreased change in temperature of the system component 112, and a polarity of the change in temperature may be negative due to the decrease in temperature.

Figure 9:
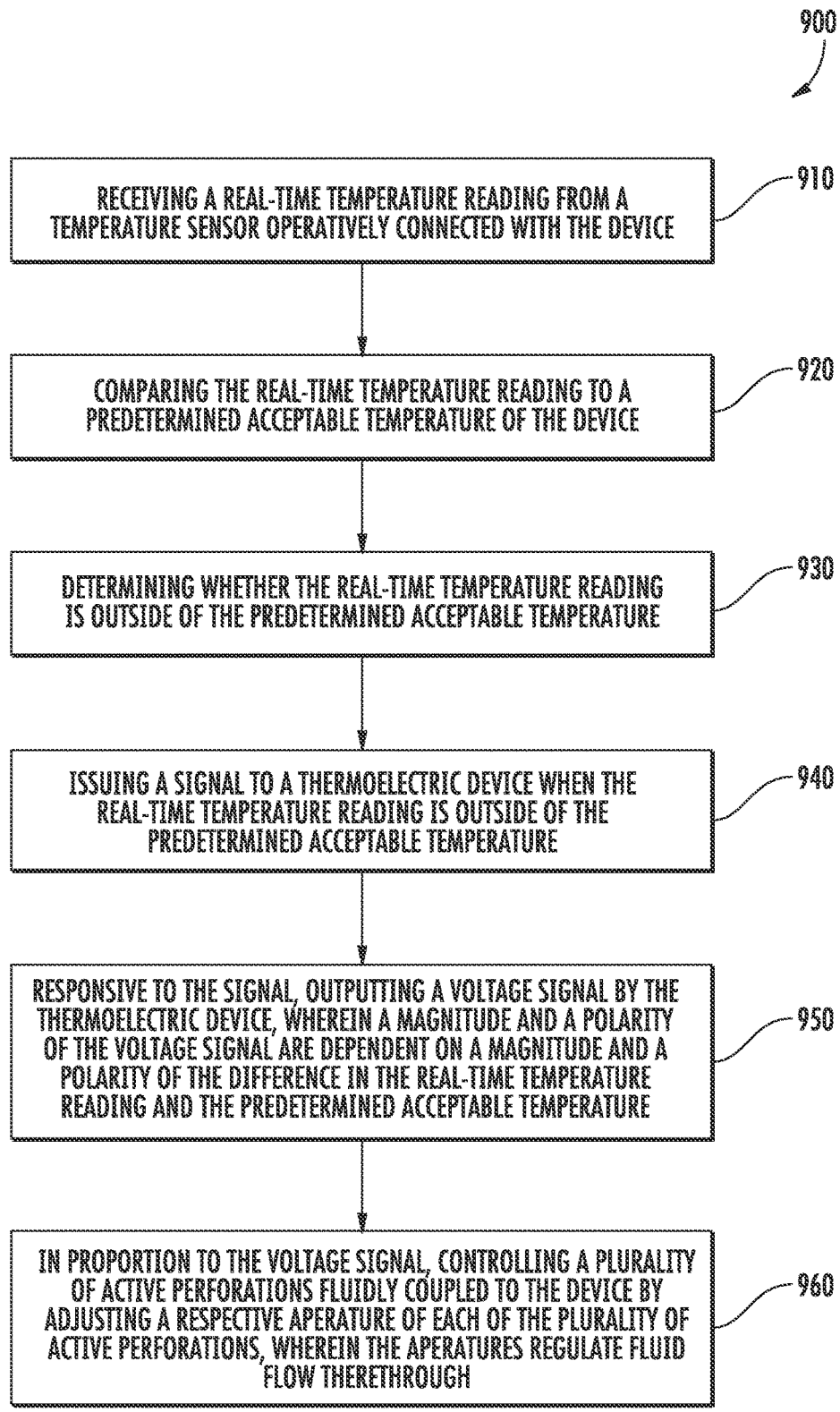
FIG. 9 illustrates a flow diagram of a method for controlling the thermal regulation of a device, according to one embodiment.

FIG. 9 is a flow diagram 900 of a method for controlling the thermal regulation of a device, according to one embodiment. Flow diagram 900 begins at operation 910, in which a real time temperature reading is received from a temperature sensor. The temperature sensor may be operatively connected with the device. The device may be any type of component, such as an electrical component and/or a computer component. The device may be, for example, a Peripheral Component Interconnect Express card (PCIe card), a graphics card, an interconnect, a motherboard, a CPU, etc. At operation 920, the real-time temperature reading is compared to a predetermined acceptable temperature of the device. At operation 930, a determination is made whether the real-time temperature reading is outside of the predetermined acceptable temperature. If the real-time temperature reading is not outside of the predetermined acceptable temperature, then no change occurs.

At operation 940, a signal is issued to a thermoelectric device when the real-time temperature reading outside of the predetermined acceptable temperature. A change in temperature may generate the signal to the thermoelectric device. At operation 950, responsive to the signal, a voltage signal is output by the thermoelectric device, wherein a magnitude and a polarity of the voltage signal are dependent on a magnitude and a polarity of the difference in the real-time temperature reading and the predetermined acceptable temperature.

At operation 960, in proportion of the voltage signal, a plurality of active perforations fluidly coupled to the device are controlled by adjusting a respective aperture of each of the plurality of active perforations, wherein the apertures regulate fluid flow therethrough. The diameter of the aperture may be dependent upon the magnitude and the polarity of the voltage signal, which may depend on the difference in the real-time temperature reading and the predetermined acceptable temperature. A larger aperture allows for more fluid to flow through the aperture. A smaller aperture allows for less fluid to flow through the aperture.

For example, a positive voltage signal may be output by thermoelectric device if the real-time temperature is greater than the predetermined acceptable temperature. Additionally, the plurality of active perforations 120 may open to expose an aperture 122 when the positive voltage signal is received by the plurality of active perforations 120. As such, the diameter of the aperture 122 may correspond with the magnitude of the positive voltage signal received. For example, when a low magnitude positive voltage signal is received by the plurality of active perforations 120 the plurality of active perforations 120 may only slightly open. However, when a large magnitude positive voltage signal is received by the plurality of active perforations 120, the plurality of active perforations 120 may fully open.

By way of additional example, a negative voltage signal may be generated by the thermoelectric device if the real-time temperature is less than the predetermined acceptable temperature. Additionally, the plurality of active perforations 120 may close such that an aperture 122 is not exposed when the negative voltage signal is received by the plurality of active perforations 120. As such, the diameter of the aperture 122 may correspond with the magnitude of the negative voltage signal received. For example, when a low magnitude negative voltage signal is received by the plurality of active perforations 120, the plurality of active perforations 120 may only slightly close. However, when a large magnitude negative voltage signal is received by the plurality of active perforations 120 the plurality of active perforations 120 may fully close.

Optionally, a fan (not shown) may be coupled with the device to increase the fluid flow through an active perforation 120 that is in an open position and/or around an active perforation 120 that is in a closed position. Operations 910-960 may be repeated as the device continues to operate and/or be utilized.

The cooling of servers, computers, electrical components, and other electronic devices or systems can be complicated as regulating and directing the airflow to areas of need therewithin can be challenging. The regulation of air flow for the cooling of critical electrical components may be especially difficult during fan failure scenarios. Active perforations are advantageous to increase and decrease the inlet of air to the system in order to regulate airflow and balance the back pressure in the system. To illustrate, during periods of utilization, especially during maximum utilization, system components may require increased airflow. However, during periods of non-utilization the same system component may not require as much airflow. In such a scenario the active perforation(s) may be opened when the system component is being utilized and closed to redirect the airflow to other system components when not being utilized, thus leading to properly cooled system components and a reduction in exposure time to high temperatures. Overall, equipment failures and damage to the equipment may be prevented.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A thermal regulation system for controlling fluid flow through an electronic device, the thermal regulation system comprising:
   an active perforation layer having a plurality of active perforations thereon, wherein each active perforation defines a controllable aperture, the active perforation layer comprising:

an elastomeric layer;

a substrate coupled to the elastomeric layer, wherein the substrate provides a fluid channel and at least one expandable reservoir for each active perforation, and wherein the fluid channel has a fluid inlet and a fluid outlet; and an operating fluid operatively connected with the fluid channel, wherein the operating fluid enters the fluid channel via the fluid inlet to expand the expandable reservoir and exits the fluid channel via the fluid outlet.

2. The thermal regulation system of claim 1, further comprising at least one temperature sensor in operable communication with the electronic device.

3. The thermal regulation system of claim 2, wherein an aperture size of each controllable aperture is controllable between a first position, a second position, and a third position based on an input received from the temperature sensor, wherein the first position is a closed position, the second position is an open position, and the third position is a position between the first position and the second position.

4. The thermal regulation system of claim 3, wherein in the first position no fluid is passed through the active perforation layer, and wherein in the second and third positions fluid is passed through the active perforation layer.

5. The thermal regulation system of claim 1, further comprising a pump operatively connected to the fluid channel and configured to drive the operating fluid through the fluid channel.

6. The thermal regulation system of claim 1, wherein when the operating fluid is moved through the fluid channel a surface of the active perforation layer is expanded or contracted to change a dimension of the active perforation.

7. The thermal regulation system of claim 1, wherein the active perforation layer is a polymer coating.

* * * * *